United States Patent [19]

Ige et al.

[11] Patent Number: 5,291,169
[45] Date of Patent: Mar. 1, 1994

[54] OPEN ARCHITECTURE MAGNETIC RESONANCE IMAGING SUPERCONDUCTING MAGNET ASSEMBLY

[75] Inventors: Oluwasegun O. Ige; Bu-Xin Xu, both of Florence, S.C.

[73] Assignee: General Electric Company, Milwaukee, Wis.

[21] Appl. No.: 970,511

[22] Filed: Nov. 2, 1992

[51] Int. Cl.$^5$ ................................................. H01F 7/22
[52] U.S. Cl. ........................................ 335/216; 335/299; 324/319
[58] Field of Search ................. 335/216, 296–301; 324/318–320; 505/892, 893, 879, 898

[56] References Cited

U.S. PATENT DOCUMENTS 4,490,675 12/1984 Knuettel et al. .................... 324/319
4,924,198 5/1990 Laskaris ............................. 335/216

Primary Examiner—Lincoln Donovan
Assistant Examiner—Raymond Barrera
Attorney, Agent, or Firm—Irving Freedman; James O. Skarsten

[57] ABSTRACT

An open architecture Magnetic Resonance Imaging Magnet with a pair of spaced annular superconducting magnet assemblies utilizing a cantilevered main magnet coil and correction magnet coil within each assembly.

7 Claims, 3 Drawing Sheets

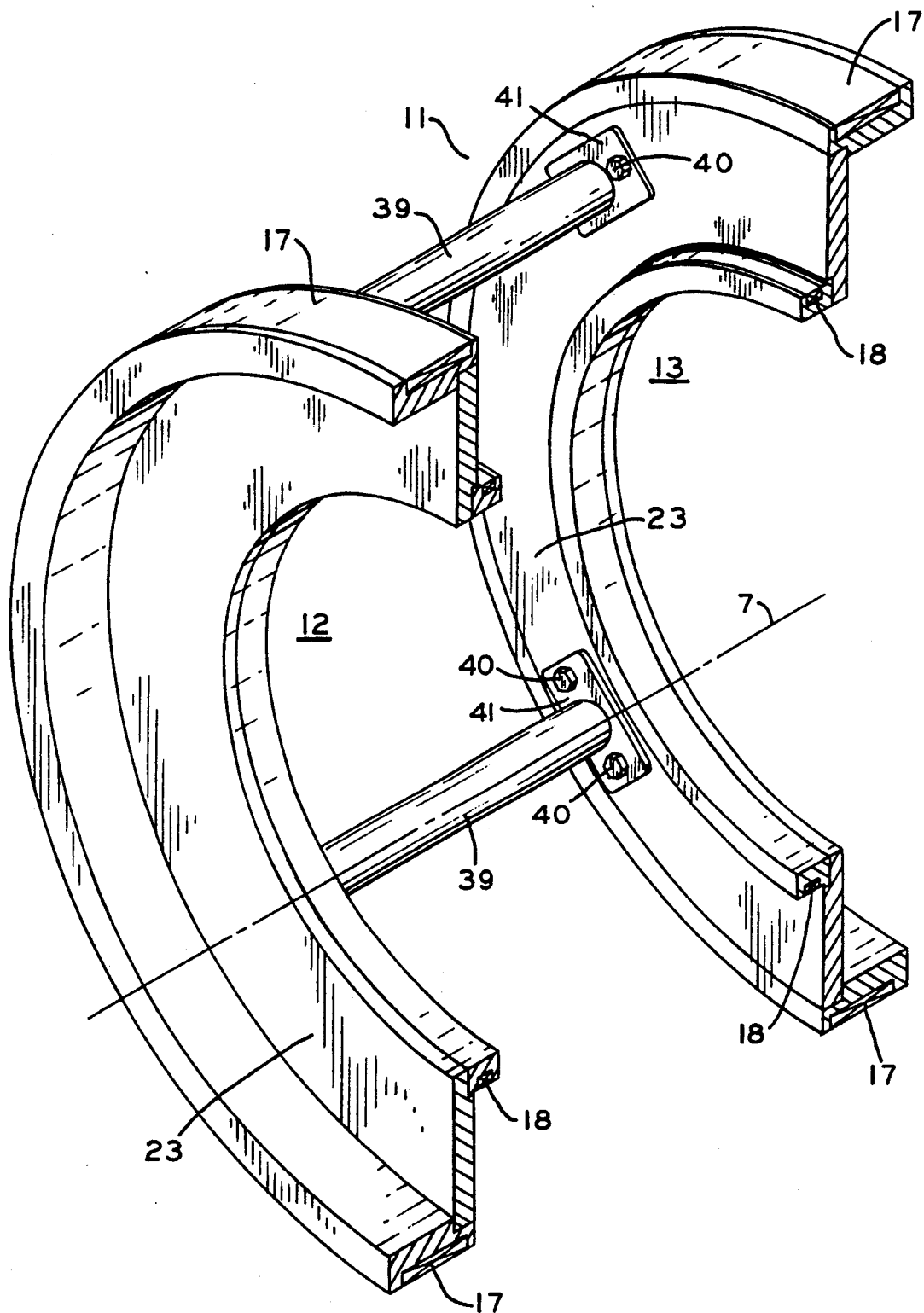
FIG_2

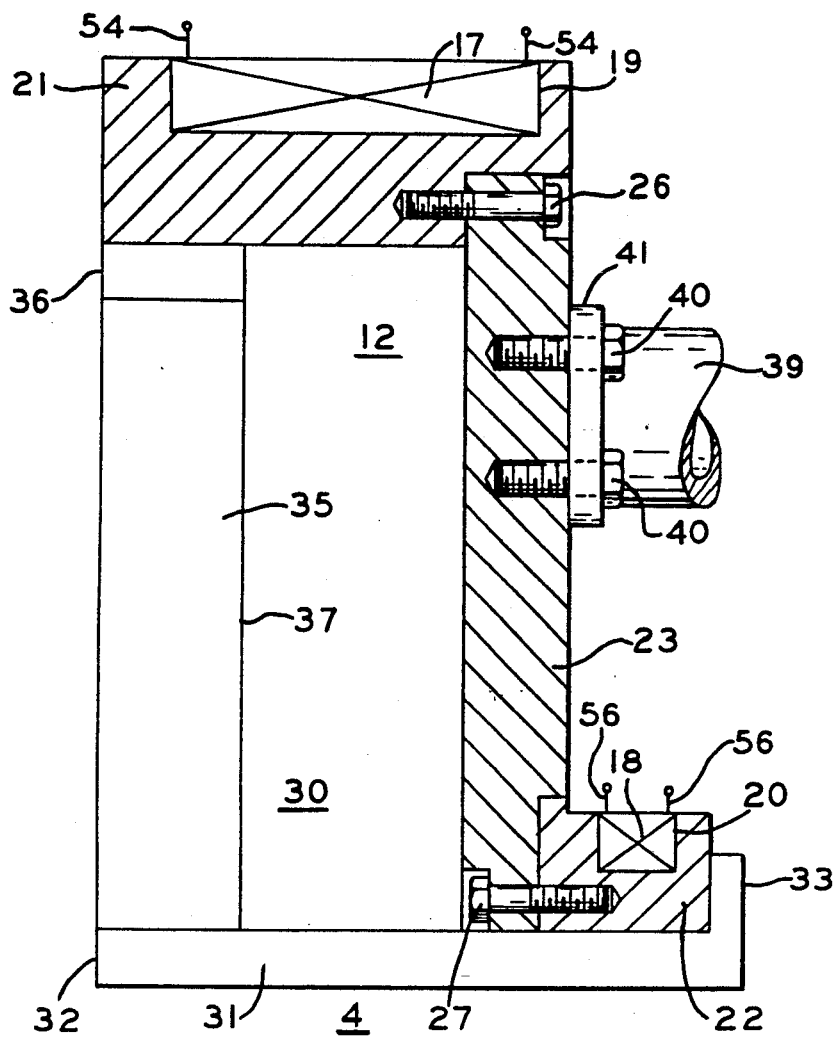
FIG_3
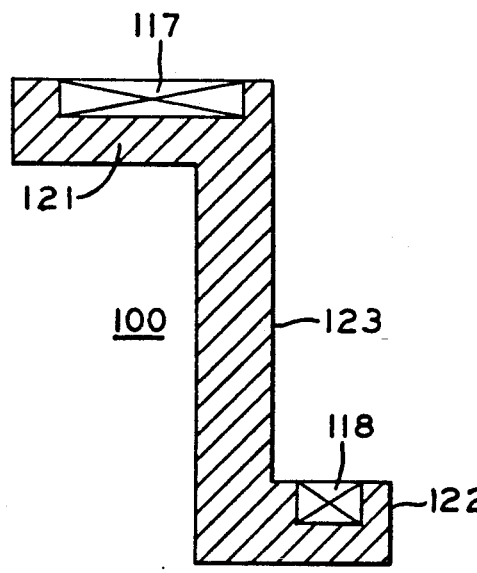
FIG_4
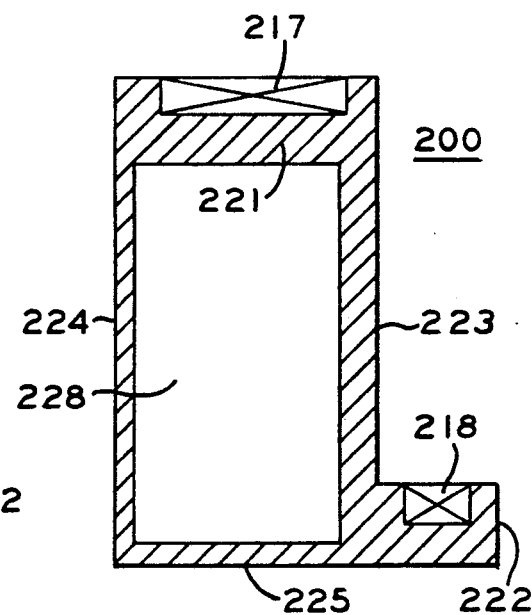
FIG_5

OPEN ARCHITECTURE MAGNETIC RESONANCE IMAGING SUPERCONDUCTING MAGNET ASSEMBLY

BACKGROUND OF INVENTION

This invention relates to an open architecture superconducting magnet assembly for a magnetic resonance imager (hereinafter called "MRI").

As is well known, a superconducting magnet can be made superconducting by placing it in an extremely cold environment, such as by enclosing it in a cryostat or pressure vessel containing liquid helium or other cryogen. The extreme cold ensures that the magnet coils are superconducting, such that when a power source is initially connected to the coil (for a period, for example, of ten minutes) to introduce a current flow through the coils, the current will continue to flow through the coils even after power is removed due to the absence of resistance, thereby maintaining a magnetic field. Superconducting magnets find wide application in the field of MRI.

Considerable research and development efforts have been directed at eliminating the need for a boiling cryogen such as liquid helium. While the use of liquid helium to provide cryogenic temperatures has been widely practiced and is satisfactory for MRI operation, helium is found and commercially obtained only in the state of Texas. As a result, the provision of a steady supply of liquid helium to MRI installations all over the world has proved to be difficult and costly. This has led to considerable effort being directed at superconducting materials and magnet structures which can be rendered superconducting at relatively higher temperatures such as ten degrees Kelvin (10K), which can be obtained with conduction cooling.

Another problem encountered by most MRI equipments is that they utilize solenoidal magnets enclosed in cylindrical structures with a central bore opening for patient access. However, in such an arrangement, the patient is practically enclosed in the warm bore, which can induce claustrophobia in some patients. The desirability of an open architecture in which the patient is not essentially totally enclosed has long been recognized. Unfortunately, an open architecture structure poses a number of technical problems and challenges. One problem is to provide a suitable coil support and structure which will provide the required magnetic field yet occupies much less space than conventional cylindrical structures, and yet which nevertheless can support the magnet coils under the considerable electromagnetic forces and thermal forces encountered during cool-down from ambient temperature to superconducting temperatures. Moreover, such an arrangement must still be capable of generating the very uniform yet strong magnetic field required. An open architecture MRI with which the subject invention could be used is disclosed in U.S. patent application Ser. No. 07/709,528, filed Jun. 3, 1991 by E. T. Laskar, entitled "Open MRI Magnet", assigned to the same assignee as the subject invention, and hereby incorporated by reference. Also see the patents referenced in that patent application.

Moreover, there are a number of other problems, including problems of differential thermal expansion and contraction of materials, of minimizing cost, and of handling the forces generated by the significant magnetic fields required. All of these overlapping and conflicting requirements must be satisfied for a practical and satisfactory MRI superconducting magnet structure.

OBJECTS AND SUMMARY OF INVENTION

It is an object of the present invention to provide an improved superconducting magnet structure for an open architecture MRI.

It is another object of the present invention to provide an improved superconducting magnet structure for an open architecture MRI which can withstand the severe mechanical, thermal and electromagnetic forces encountered during cool-down and during operation.

It is yet another object of the present invention to provide an improved superconducting magnet structure for an open architecture MRI which is relatively lightweight, simple, and relatively inexpensive to manufacture, and which is suitable for use with conduction cooling.

In accordance with one form of the invention, an open architecture superconducting MRI magnet utilizes two superconducting magnet assemblies, each of which includes a main magnet coil and a correction coil on a coil support structure. The correction coils are smaller in radius than the main coils and carry current in opposite direction to that of the main coils. The main magnet coil is positioned on a form fastened to one side of a stainless steel flange, and the correction coil is positioned on a form fastened to the opposite side of the stainless steel flange closer to the central bore of the magnet assembly. The two magnet assemblies are connected by four stainless steel posts which provide substantial openings within the MRI bore. During assembly, the various parts of the superconducting magnet assembly are held in place by means of a fixture, after which the whole assembly is placed in an oven for vacuum impregnation of the coils with epoxy. Conduction cooling may be used to attain superconducting temperatures.

BRIEF DESCRIPTION OF INVENTION

FIG. 2 is a perspective view, partially in cross section, showing details of the coil support structure of FIG. 1.

FIG. 3 is an enlarged cross section of the coil support structure shown in FIGS. 1 and 2 and including fixtures utilized during the manufacture of the coil support structure.

FIG. 4 is an alternate embodiment of FIG. 3 in which the coil support structure is a unitary casting.

FIG. 5 is an alternate embodiment of that shown in FIG. 4 and in which the casting is in box form, particularly suitable for use with certain materials.

Figure 1:
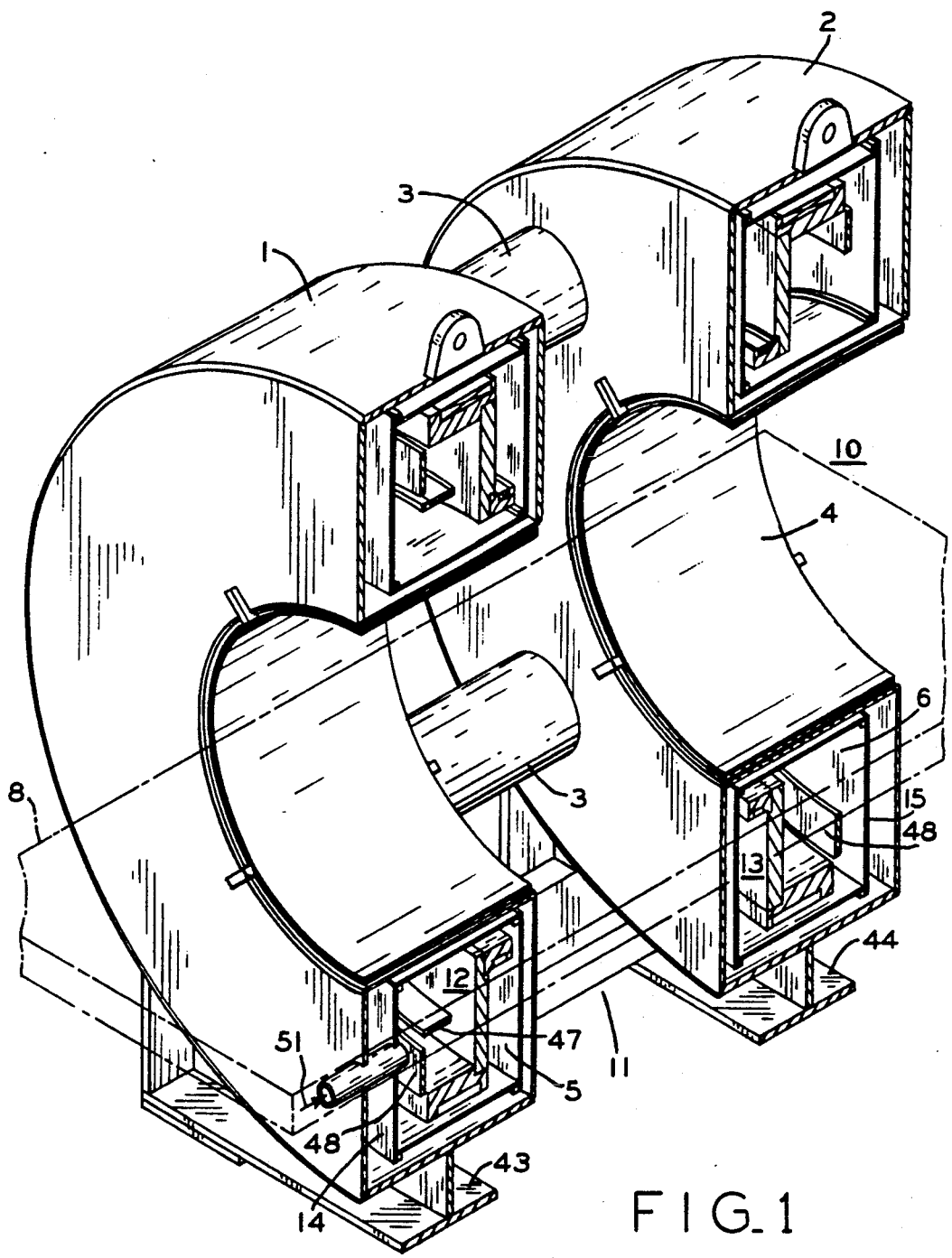
FIG. 1 is a perspective view, partially in cross section, of the MRI superconducting magnet of the present invention.

Referring first to FIGS. 1-3, superconducting magnet assembly 10 includes a pair of toroidal-shaped vacuum vessels or housings 1 and 2 separated by four axially extending stainless steel spacers 3 positioned around axis 7 of substantially cylindrical central bore 4. The structure is symmetrically arranged about bore 4 of superconducting magnet assembly 10. It is to be noted that the overall structure formed by vacuum vessels 1 and 2 and spacer posts 3 provides substantial openings or open space 11 between vacuum vessels 1 and 2 which avoids enclosure of the patient positioned on patient support shown generally by dashed member 8.

Annular cylinders 14 and 15 of rectangular cross section are radiation shields between superconducting magnet coil assemblies 12 and 13, respectively, and vacuum vessels 1 and 2, respectively, as best shown in FIG. 1. Each superconducting magnet assembly 12 and 13 includes an annular main magnet coil 17 and an annular correction magnet coil 18, wound in cavities or annular grooves 19 and 20 with rectangular cross section, respectively, within main magnet coil form 21 and annular correction magnet coil form 22, respectively. Magnet coils 17 and 18 are wound of copper stabilized niobium tin ($Nb_3Sn$) ribbon conductor. Main magnet coil form or ring portion 21 is separated from correction magnet coil form or ring portion 22 by radially extending stainless steel flange or support spacer 23 to which the coil forms are bolted by a plurality of angularly spaced bolts 26 and 27.

Conduction cooling flow indicated generally by arrow 51 (see FIG. 1) provided by a cryocooler passes through conduits such a 52 to the interior annular chambers 5 and 6 of annular cylinders 14 and 15, respectively, to cool main magnet coil 17 and correcting magnet coil 18 to superconducting temperatures in the order of ten degrees Kelvin (10K) to avoid the use of liquid helium cryogen cooling. Power means to energize main magnet coil 17 is supplied by way of suitable electrical connections such as 54 (see FIG. 3), while power means to energize correction magnet coil 18 is supplied by way of suitable electrical connections such as 56.

In fabricating the cantilevered support arrangement for main magnet coil 17 and correction magnet coil 18, as shown in FIG. 3, a fixturing support assembly 30 is provided to assist in the assembly of superconducting magnet assembly 12 during its manufacture and assembly. Fixturing support assembly 30 includes correction coil fixture 31 with an axially extending annular portion 32 and a radially extending end portion 33 to support correction coil form 22. Main magnet coil fixture 35 includes radially extending annular portion 37 and axially extending portion 36.

Fixturing support assembly 30 provides support not only during assembly of coil forms 21 and 22 to flange 23, but also provides support for the subsequent vacuum impregnation of main magnet coil 17 and correction magnet coil 18, and the curing of the complete superconducting magnet coil assembly 12 in an oven.

It is to be noted that correction magnet coil 18 is smaller in axial length than main magnet coil 17 and is closer to axis 7 of coil assembly 12. After assembly of coil assembly 12, fixturing support assembly 30 is removed prior to mounting coil assembly 12 within vacuum vessel 1 (see FIG. 1).

As best shown in FIGS. 1 and 2, coil assembly 12 is spaced from and secured to coil assembly 13 by four stainless steel spacer posts 39 which are fastened to radially extending flanges 23 by a plurality of bolts 40 (also see FIG. 3) passing through stainless steel flanges 41. Coil assemblies 12 and 13, which support annular cylinders 14 and 15, respectively, are positioned within vacuum vessels 1 and 2, respectively, which in turn are supported on support or base members 43 and 44, respectively. Also shown in FIG. 1 is superconducting switch 47, and associated end rings 48 which support coil assemblies 12 and 13 within vacuum vessels 1 and 2.

FIGS. 4 and 5 illustrate unitary structures for the winding and support of the main magnet coil and correction magnet coil. Referring first to FIG. 4, unitary coil support form 100 includes radially extending flange 123 connected to axially extending annular portion 121 which supports main magnet coil 117 and, at its inner end (closest to the axis of the assembly), an axially extending portion 122 which supports correction magnet coil 118. With the coil assembly arrangement of FIG. 4, main magnet coil 117 and correction magnet coil 118 can not be separately wound on their coil forms 121 and 122, respectively, and later assembled to radially extending flange 123 as in the case of the arrangement shown in FIG. 3. The unitary support form 100 thus combines main magnet coil support form 121 and correction magnet coil support form 122 in a unitary structure with radially extending flange 123 and may be cast of stainless steel or a composite material of comparable thermal expansion coefficient to fiber-reinforced plastic (FRP), in order to reduce the weight of the structure. In the case of FRP, it may be desirable to cast the structure with a cross section of boxed form, such as shown in FIG. 5, in order to minimize deflections in the coils during operation. Referring to FIG. 5, main magnet coil form 221, correction magnet coil form 222, and radial flange 223 are interconnected by radial support surface 224 and axial support surface 225, resulting in a substantially rectangular annular interior 228 of the structure.

A partial weight reduction may be realized by replacing the stainless steel flange 23 of FIG. 3 with a rigid, high-strength, composite material of comparable thermal expansion coefficient to FRP. Such a material may be G-10 or phenolic.

The coil assemblies 12 and 13 are particularly suited for use in a low-field magnet, that is one that is less than 0.35 Tesla, and in which the loading forces are dominated by thermally-induced forces although the main magnet coils such as 17 produce strong magnetic fields and forces. Any deflections or movement during operation of the components of the coil support structure of coil assemblies 12 and 13, and the stresses in the superconductors with which the coils are wound, have a major impact on the homogeneity of the resulting magnetic field and superconducting magnet coil performance. However, the subject design minimizes deflections and stresses in the magnetic coils. In the structure wherein the coil forms 21 and 22 are E-glass/epoxy-based FRP, the flange may be made of stainless steel to provide strength, and also to provide a thermal coefficient of expansion which is close to that of the E-glass-/epoxy-based FRP coil form.

As a result, the present invention has proved to provide an open architecture MRI capable of withstanding the significant electromagnetic and thermal forces and loading encountered in use, while providing the necessary electrical, magnetic and structural characteristics. The open architecture provides openings or open space 11 between vacuum vessels 1 and 2 to minimize confinement of the patient.

While the present invention has been described with respect to certain preferred embodiments thereof, it is to be understood that numerous variations in the details of construction, the arrangement and combination of parts, and the type of materials used may be made without departing from the spirit and scope of the invention.

What we claim is:

1. An open architecture Magnetic Resonance Imaging Magnet utilizing a bore about an axis to receive patients, and providing open radial space to minimize confinement of patients within the bore, comprising:

a first annular magnet assembly housing positioned about said axis;

a second annular magnet assembly housing positioned about said axis, and spaced from and substantially parallel to said first magnet assembly;

said bore formed by the central regions of said first and second magnet assembly housings about said axis;

a plurality of spacers extending between said first magnet assembly housing and said second magnet assembly housing substantially parallel to said axis;

each of the magnet assembly housings including:

an annular chamber;

a magnet coil assembly within said annular chamber of the housing and including a main magnet coil and a correction magnet coil;

said magnet assembly including a coil support structure secured within said annular chamber with a first axially extending ring portion adjacent to said bore and including a first annular groove, a second axially extending ring portion remote from the bore of said annular chamber and including a second annular groove, and a radially extending support spacer extending between said first ring and said second ring;

said first and said second axially extending ring portions supported on opposite sides of said radially extending support spacer;

said first annular groove being significantly smaller than said second annular groove;

a main superconducting magnet coil positioned within said second annular groove;

a correction superconducting magnet coil positioned within said first annular groove;

said correction superconducting magnet coil being significantly smaller in diameter about said axis and in axial length than said main superconducting magnet coil;

means to energize said main and correction superconducting coils;

conduction cooling means to cool the interior of each said magnet assembly to superconducting temperatures;

said first ring and said second ring being secured to said radially extending support spacer and forming a coil support annular structure with a substantially Z-shaped cross section providing support for said coils which minimizes deflections and stresses in said coils due to thermally-induced and magnetic forces; and a patient support member within and extending axially through said bore parallel to said spacers providing open space about the patient in the radial direction between said magnet coil assemblies and in the bore at the remote ends of said magnet assembly housings to minimize confinement and effects of claustrophobia of the patient within said bore.

2. The open architecture Magnetic Resonance Imaging Magnet of claim 1 wherein said first ring, said second ring and said radially extending support spacer are included in a cast unitary structure having a substantially Z-shaped cross section.

3. An open architecture Magnetic Resonance Imaging Magnet utilizing a bore about an axis to receive patients, and providing open space to minimize confinement of patients within the bore, comprising:

a first annular magnet assembly housing positioned about said axis;

a second annular magnet assembly housing positioned about said axis, and spaced from and substantially parallel to said first magnet assembly;

said bore formed by the central regions of said first and second magnet assembly housings about said axis;

a plurality of spacers extending between said first magnet assembly housing and said second magnet assembly housing substantially parallel to said axis;

each of the magnet assembly housing including:

an annular chamber;

a magnet coil assembly within said annular chamber of the housing and including a main magnet coil and a correction magnet coil;

said magnet assembly including a coil support structure secured within said annular chamber with a first axially extending ring portion adjacent to said bore and including a first annular groove, a second axially extending ring portion remote from the bore of said annular chamber and including a second annular groove, and a radially extending support spacer extending between said first ring and said second ring;

said first and said second axially extending ring portions supported on opposite sides of said radially extending support spacer;

said first annular groove being significantly smaller than said second annular groove;

a main superconducting magnet coil positioned within said second annular groove;

a correction superconducting magnet coil positioned within said first annular groove;

means to energize said main and correction superconducting coils;

means to cool the interior of each said magnet assembly to superconducting temperatures; and wherein an annular superconducting coil switch is secured within each of said magnet assemblies in the region between said main magnet coil and said correction coil and positioned adjacent said radially extending support spacer.

4. The open architecture Magnetic Resonance Imaging Magnet of claim 3 wherein said coil support structure is of cast composite having a thermal expansion coefficient comparable to fiber-reinforced plastic and including a cross section with an axial extension extending parallel to said second ring from said first ring, and a radial end connecting said axial extension and said second ring; forming a hollow, substantially rectangular, radial cross section.

5. An open architecture Magnetic Resonance Imaging Magnet utilizing a bore about an axis to receive patients, and providing open space between the magnet coil assemblies to minimize confinement of patients within the bore, comprising:

a first annular magnet assembly housing positioned about said axis;

a second annular magnet assembly housing positioned about said axis, and spaced from and substantially parallel to said first magnet assembly;

said bore formed by the central regions of said first and second magnet assembly housings about said axis;

a plurality of spacers extending between said first magnet assembly housing and said second magnet assembly housing substantially parallel to said axis;

each of the magnet assembly housing including:
an annular chamber;
a magnet coil assembly within said annular chamber of the housing and including a main magnet coil and a correction magnet coil;
said magnet assembly including a coil support structure secured within said annular chamber with a first axially extending ring portion adjacent to said bore and including a first annular groove, a second axially extending ring portion remote from the bore of said annular chamber and including a second annular groove, and a radially extending support spacer extending between said first ring and said second ring;
said first and said second axially extending ring portions supported on opposite sides of said radially extending support spacer;
said first annular groove being significantly smaller than said second annular groove;
a main superconducting magnet coil positioned within said second annular groove;
a correction superconducting magnet coil positioned within said first annular groove;
means to energize said main and correction superconducting coils;
means to cool the interior of each said magnet assembly to superconducting temperatures;
wherein said first ring and said second ring are secured to said radially extending support spacer, forming a coil support annular structure with a substantially Z-shaped cross section;
wherein a patient support member extends axially through said bore; and
wherein said spacers include a flange at each end and at least one bolt extends through said flange into the adjacent magnet assembly housing.

6. The open architecture Magnetic Resonance Imaging Magnet of claim 5 wherein said spacers are stainless steel.

7. The open architecture Magnetic Resonance Imaging Magnet of claim 5 wherein said support spacer is a composite material with a thermal expansion coefficient comparable to that of fiber-reinforced plastic.

* * * * *